United States Patent

Kim et al.

[11] Patent Number: 5,830,790
[45] Date of Patent: Nov. 3, 1998

[54] HIGH VOLTAGE TRANSISTOR OF SEMICONDUCTOR MEMORY DEVICES

[75] Inventors: Jhang-Rae Kim, Suwon; Jeong-Hyuk Choi, Seoul, both of Rep. of Korea

[73] Assignee: SamSung Electronics Co., Ltd., Kyungki-do, Rep. of Korea

[21] Appl. No.: 870,679

[22] Filed: Jun. 6, 1997

Related U.S. Application Data

[62] Division of Ser. No. 669,128, Jun. 24, 1996, which is a continuation of Ser. No. 394,342, Feb. 23, 1995, abandoned.

[30] Foreign Application Priority Data

Feb. 24, 1994 [KR] Rep. of Korea ............... 1994-3376

[51] Int. Cl.$^6$ .................. H01L 21/8238; H01L 21/76
[52] U.S. Cl. ............................... 438/227; 438/451
[58] Field of Search ..................... 438/227, 451

[56] References Cited

U.S. PATENT DOCUMENTS

| | | | |
|---|---|---|---|
| 3,755,001 | 8/1973 | Kooi et al. | 148/1.5 |
| 4,373,965 | 2/1983 | Smigelski | 148/1.5 |
| 4,404,579 | 9/1983 | Leuschner | 357/23 |
| 4,412,375 | 11/1983 | Matthews | 438/227 |
| 4,468,852 | 9/1984 | Cerofolini | 438/227 |
| 4,700,454 | 10/1987 | Bearg et al. | 438/227 |
| 4,791,464 | 12/1988 | Ipri et al. | 357/23.7 |
| 4,912,062 | 3/1990 | Verma | 438/451 |
| 4,974,052 | 11/1990 | Matloubian et al. | 357/52 |
| 5,012,312 | 4/1991 | Kawamoto | 357/23.11 |
| 5,434,099 | 7/1995 | Hsue | 438/451 |
| 5,529,948 | 6/1996 | Lur et al. | 438/451 |
| 5,599,731 | 2/1997 | Park | 438/451 |

OTHER PUBLICATIONS

"An ASIC–Compatible EEPROM Technology", 1992 IEEE Custom Integrated Circuits Conference. Month Unknown.

*Primary Examiner*—John Niebling
*Assistant Examiner*—Michael S. Lebentritt
*Attorney, Agent, or Firm*—Cushman Darby & Cushman IP Group of Pillsbury Madison & Sutro LLP

[57] ABSTRACT

The present invention relates to a high voltage transistor of a semiconductor memory device, and more particularly to a high voltage transistor which improves element isolation and breakdown voltage characteristics thereof. A high voltage transistor formed on a semiconductor substrate comprising a first and second diffusion regions doped by a first conductive impurity which are separated from each other by a channel region doped by a second conductive impurity, the channel region, and a gate electrode interposing a gate oxide layer, the first and second diffusion regions and the channel region being surrounded with an oxide layer for isolating elements having a second conductive channel stop layer on the lower portion thereof, characterized in that the density of a second conductive impurity doped in the regions where a boundary area in a direction of channel length of each of the first and second diffusion regions is contacted with a boundary area of the oxide layer for isolating elements is lower than that of a second conductive impurity doped in the regions where a boundary area in a direction of channel width of each of the first and second diffusion regions is contacted with the boundary area of the oxide layer for isolating elements.

18 Claims, 9 Drawing Sheets

HIGH VOLTAGE TRANSISTOR OF SEMICONDUCTOR MEMORY DEVICES

This is a divisional of application Ser. No. 08/669,128, filed Jun. 24, 1996; which is a continuation of application Ser. No. 08/394,342, filed Feb. 23, 1995, now abandoned.

BACKGROUND OF THE INVENTION

The present invention relates to a high voltage transistor of a semiconductor memory device, and more particularly to a high voltage transistor which improves element isolation and breakdown voltage characteristics thereof.

A semiconductor memory device using a high voltage, such as an electrically erasable programmable read-only-memory EEPROM device using a high voltage raised by boosting in the interior of the memory device a power supply applied from an exterior device thereof, generally employs a metal-oxide-semiconductor MOS transistor operable in a high voltage condition. Such a high voltage transistor should have sufficient internal pressure and insulation. Typically, a high voltage transistor fabrication process is made up of a process of forming well on a substrate, a field ion-implantation and field oxide process of defining an active region on the well and of isolating elements, an ion-implantation process of adjusting a threshold voltage, a process of forming a gate oxide layer and a gate electrode, an n− source/drain ion-implantation process and drive-in process, and an n+ source/drain ion-implantation process. The prior art related to such a high voltage transistor is disclosed in pages 9.5.1 to 9.5.4. of 'IEEE 1992 custom integrated circuits conference', published in 1992.

Figure 1:
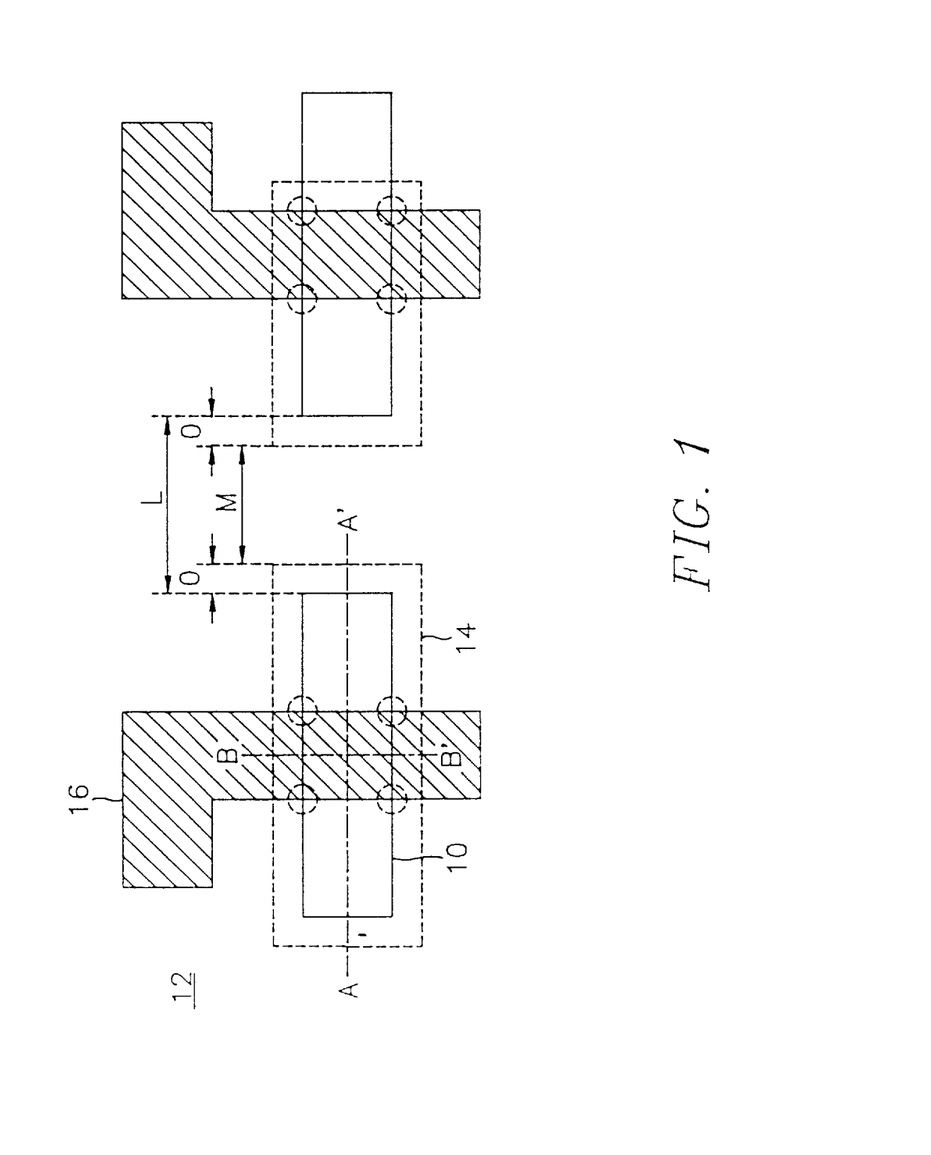
FIG. 1 is a view showing a layout of a conventional high voltage transistor on a substrate.

FIG. 1 is a view showing a layout of a conventional high voltage transistor formed on a substrate. FIGS. 2a–2e are cross sectional views showing fabrication processes of the conventional high voltage transistor taken along lines A–A' and B–B' of FIG. 1. Referring to FIG. 1, definition of an active region 10 on the well formed on the semiconductor substrate is made. The other surface of the substrate except the active region 10 is surrounded with a field oxide layer 12 for isolating elements. At the lower portion of the field oxide layer 12, a channel stop layer 28 made by a field ion-implantation is formed. At this time, the field ion-implantation is achieved by making a field ion-implantation pattern mask indicated by a dotted line of FIG. 1 and thereby, a larger region than the active region 10 is masked by the field ion-implantation. Hence, the channel stop layer is not formed on the lower portion of the field oxide layer 12 being in contact with the active region 10. On the middle portion of the active region, a gate electrode 16 interposing a gate dielectric layer is formed, expended in a cross direction to a source/drain path.

Figure 2A:
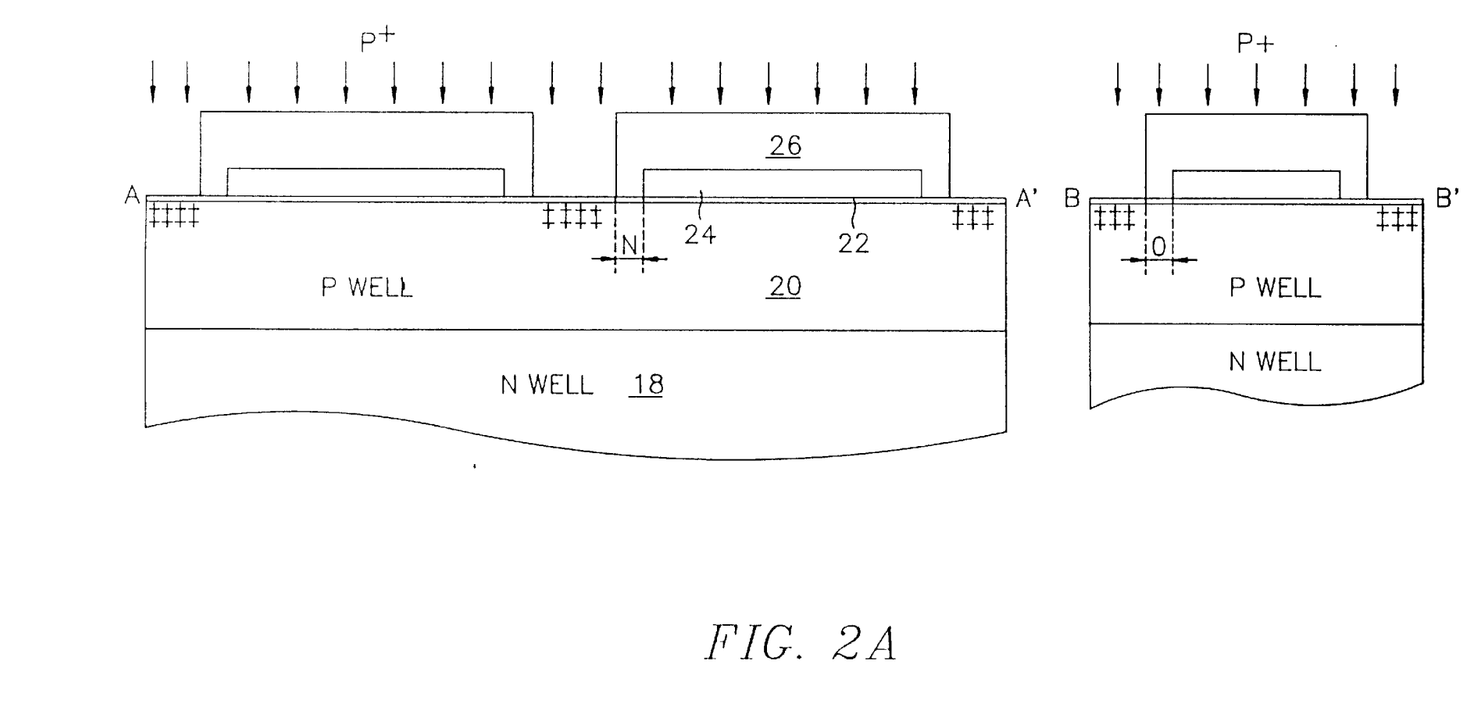
FIGS. 2a–2e are cross sectional views showing production processes of the conventional high voltage transistor taken along lines A–A' and B–B' of FIG. 1.
Figure 2B:
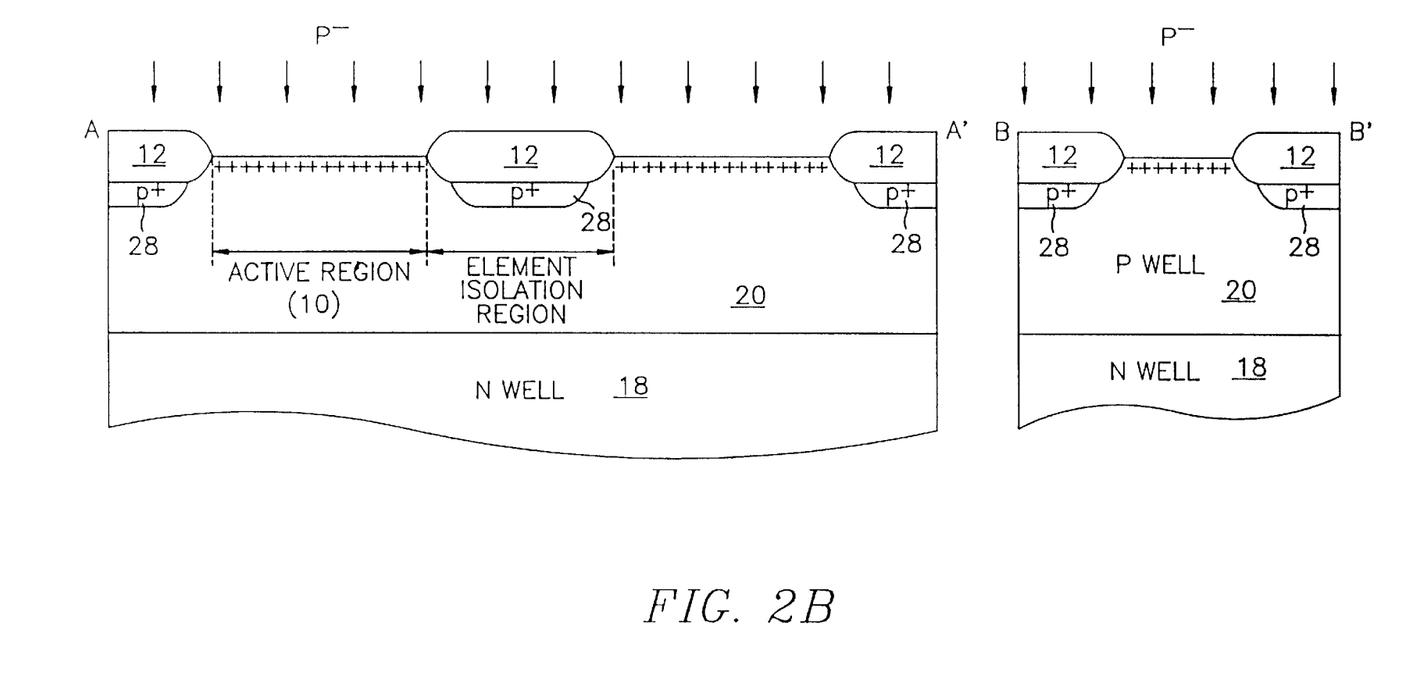

FIGS. 2a and 2b are cross sectional views showing a fabrication process of forming the active region 10 and the field oxide layer 12 for isolating elements. Firstly referring to FIG. 2a, a pad oxide layer 22 is formed on the upper portion of a P-well 20 disposed in the interior of an N-well 18 formed on the substrate, on which a nitride layer pattern 24 is formed, and a photoresist layer pattern 26 is formed with a larger width by a distance O than that thereof on the upper portion of the nitride layer pattern 24. Thereafter, ion-implantation of a p-type impurity is performed in making a mask for the photoresist layer pattern 26. The nitride layer pattern 24 is masked for a local oxidization in a typical LOCOS process and the surface of the substrate on the lower portion thereof becomes the active region 10. The photoresist layer pattern 26 serves as a field ion-implantation mask for forming the channel stop layer on the lower portion of the field oxide layer 12. Here, the p-type impurity implanted in making a mask for the photoresist layer pattern 26 forms the channel stop layer. At this time, since the width of the photoresist layer pattern 26 is larger by the distance O than that of the nitride layer pattern 24, the region driven by the ion-implantation is smaller than the width of the field oxide layer 12. The reason why the region of the field ion-implantation is masked to be larger than the active region is that deep depletion arises, by the gate electrode to which a high voltage is applied, in the region where the boundary area of an n+ drain and the field oxide layer 12 is adjacent to the gate electrode 16, so that a gate induced breakdown occurs and a breakdown voltage of the transistor falls down accordingly. Hence, the n+ source/drain region and the channel stop layer 28 are separated from each other to prevent the interaction thereof, thus preventing the breakdown voltage of the transistor from being reduced. The N-well 18 may be an n-type silicon substrate. In addition, P-well 20 may be an p-type silicon substrate. (At this time, N-well 18 is not formed.)

Referring to now FIG. 2b, after completion of the field ion-implantation, the photoresist layer pattern 26 is removed and thermal oxidization of the substrate is executed, thus forming the field oxide layer 12 for isolating elements and simultaneously forming p+ channel stop layer 28 on the lower portion thereof by treating the implanted ions with heat. Thereafter, the nitride layer pattern 24 is removed and a threshold voltage adjusting p− ion-implantation is performed on the whole substrate. Since the region of the field ion-implantation is masked to be larger than that an element isolation region, the channel stop layer 28 has a smaller region than the element isolation region.

Figure 2C:
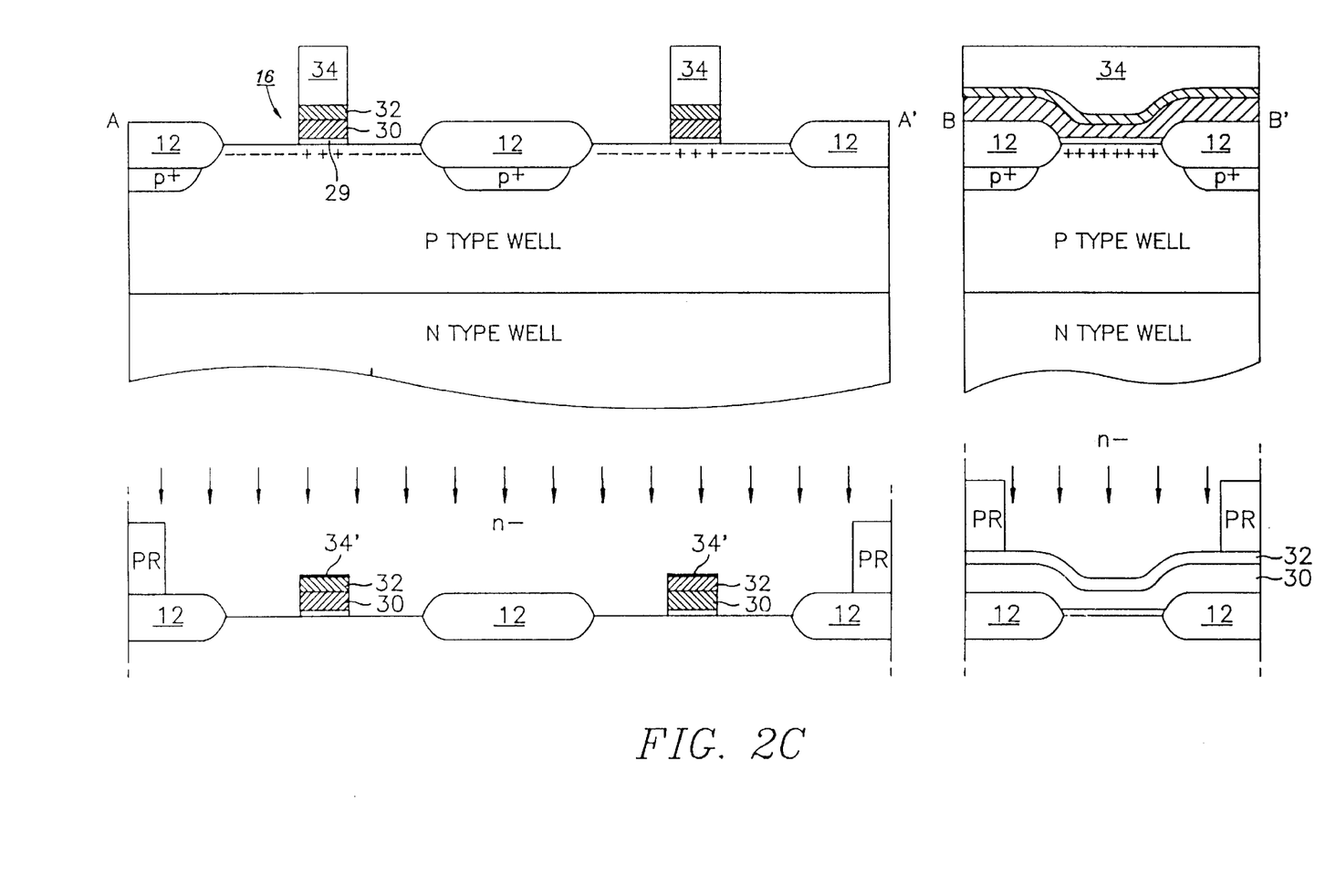

Referring to FIG. 2c, a gate oxide layer 29, polycrystalline silicon 30, and silicide layer 32, for example tungsten silicide, are sequentially deposited upon the whole of the substrate. Then, the layers are etched by using a photoresist layer pattern 34 and the pattern of the gate electrode 16 is formed on the active region 10. After the photoresist layer pattern 34 is removed, the photoresist layer 34' is formed to form the n+S/D region of the high voltage transistor. Thereafter, n− ion-implantation is performed for forming n− source/drain region.

Figure 2D:
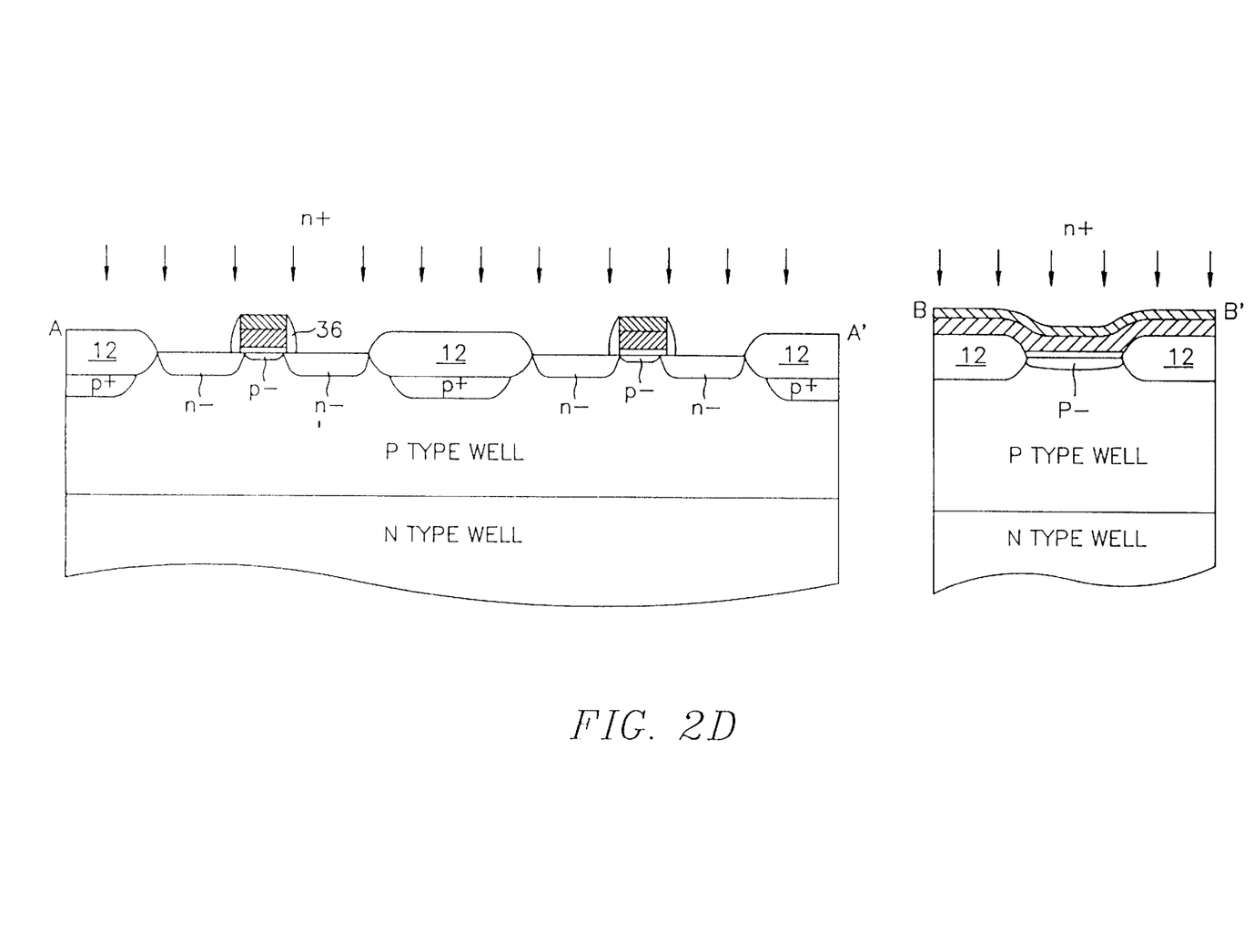

Referring to FIG. 2d, after the photoresist layer 34' is removed and the substrate is treated with heat, the n− source/drain region is formed by diffusing the n− ion-implanted impurity. Then, the threshold voltage is adjusted by diffusing the ion-implanted p-type impurity on the lower portion of the gate electrode 16. Thereafter, the insulating layer is deposited on the whole of the substrate and is etched-back in the anisotropic etching manner. An insulating layer spacer 36 is then formed on the side wall of the gate electrode 16. The n-type impurity is implanted for forming the n+ source/drain region.

Figure 2E:
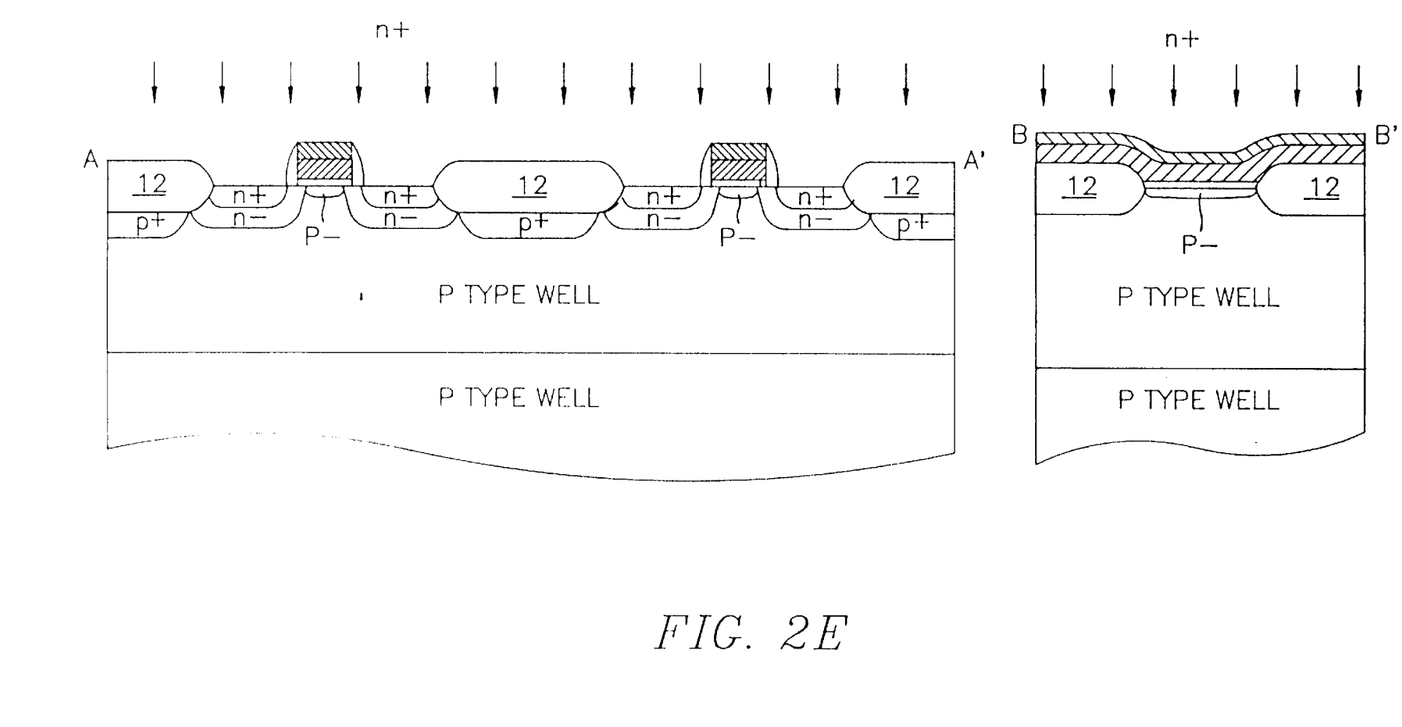

Referring to FIG. 2e, the substrate is treated with heat and the n+ source/drain region is formed by diffusing the implanted n-type impurity. Accordingly, a diffusion region where is adjacent to the channel region on the lower portion of the gate electrode 16 is formed as an n− layer with a relative low density, which becomes a typical LDD structure of source/drain region.

As shown in FIGS. 1 and 2, however, if the region of the field ion-implantation pattern mask is larger than the active region, the reduction of isolated distance (L=M+2×0) between high voltage transistors is limited as the integration thereof goes higher. As a result, there are disadvantages that a high degree of integration is difficult to achieve and the element isolation force is weak because the distance of the field ion-implantation region is limited to a distance M.

Further, as can be seen from FIG. 1, a threshold voltage adjusting ion-implantation for improving punchthrough of the high voltage transistor and obtaining a target threshold voltage value is performed on the whole of the active region, so that there is a disadvantage that a gate induced breakdown is arises on the surface of the silicon substrate in the region where the boundary area of the n+ drain region and the channel region is adjacent to the gate electrode, thus reducing the breakdown voltage of the high voltage transistor.

SUMMARY OF THE INVENTION

It is an object of the present invention to provide a high voltage transistor which improves an element isolation characteristic by improving a masking method in performing field ion-implantation thereof according to the high-density of the semiconductor memory elements.

It is another object of the present invention to provide a high voltage transistor which increases a breakdown voltage thereof by improving a masking method in performing threshold voltage adjusting ion-implantation.

In accordance with one aspect of the present invention, a field ion-implantation mask pattern for forming a channel stop layer is laid out in order to have a smaller length than that of an active region by a predetermined distance in a direction of channel length and to have a larger width than that of width of the active region by a predetermined distance in a direction of channel width. Accordingly, the field ion-implantation is performed on the whole of the element isolation region, thus enabling the element isolation with the transistor to be strengthened. In addition, the region where a gate induced breakdown is arisen is masked to be larger than the active region, thus preventing the interaction between the field ion-implantation region and the n+ drain region and thereby preventing the breakdown voltage of the high voltage transistor according to the gate induced breakdown from being reduced.

In accordance with another aspect of the present invention, a masking operation for threshold voltage adjusting ion-implantation is performed by cutting off the ion-implantation in the region where a boundary area of a diffusion region operating as a drain region and a field oxide layer is adjacent to a gate electrode.

BRIEF DESCRIPTION OF THE DRAWINGS

A more complete appreciation of this invention, and many of attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 3A:
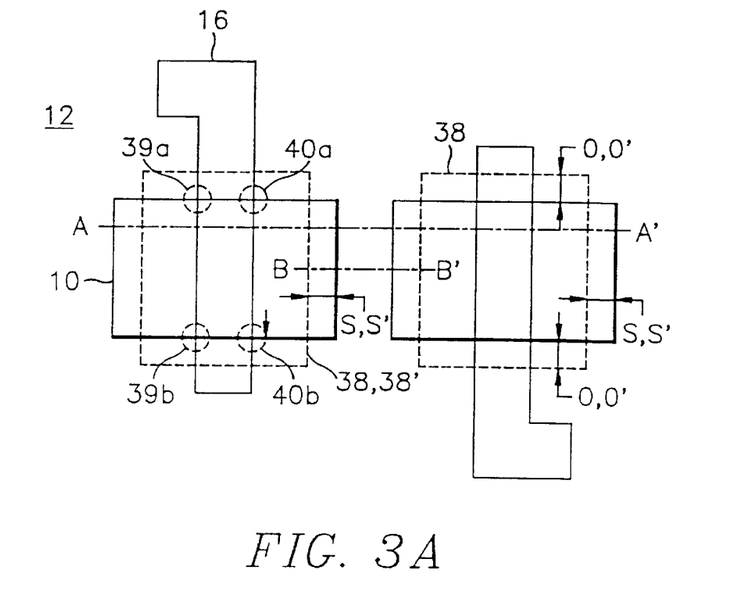
FIGS. 3a–3c are views showing a first embodiment of a high voltage transistor according to the present invention.
Figure 3B:
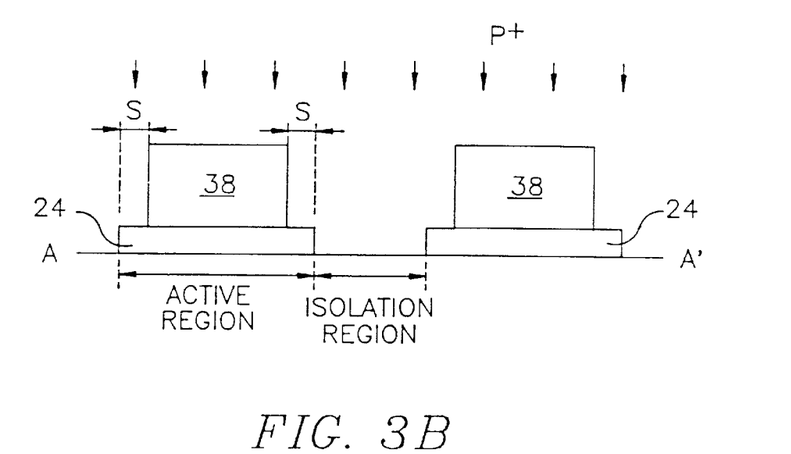
Figure 3C:
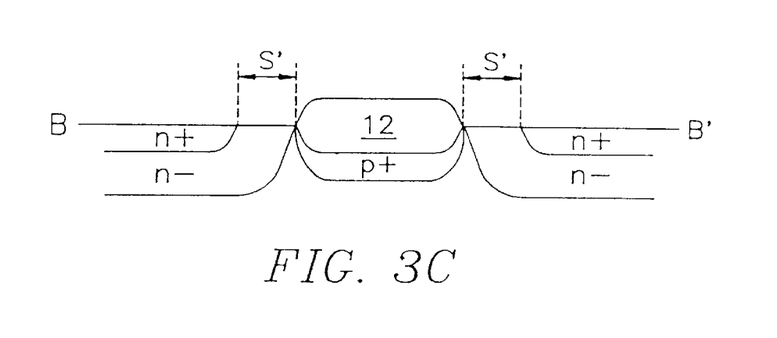

FIG. 3 is a view showing a first embodiment of a high voltage transistor according to the present invention, wherein FIG. 3a is a layout view showing the high voltage transistor deposited on the substrate, FIG. 3b is a cross sectional view showing a fabrication process of field ion-implantation taken along lines A–A' of FIG. 3a, and FIG. 3c is a cross sectional view showing the completion of a fabrication process of the n+ source/drain taken along lines B–B' of FIG. 3a.

Referring to FIGS. 3a–3c, definition of an active region 10 is made on the wells formed on the substrate. The other surface of the substrate except the active region 10 is surrounded with a field oxide layer 12 for isolating elements. At the lower portion of the field oxide layer 12 is formed a channel stop layer made by the field implantation. At this time, the field ion-implantation is achieved in making a mask for a field ion-implantation pattern 38 indicated by a dotted line of FIG. 3. A field ion-implantation mask pattern 38 is laid out in order to have a smaller length than that of the active region 10 by a distance S in the direction of the channel length of a transistor positioned on the lower portion of a gate electrode 16 and to have a larger width than channel width of a transistor is larger than that of the active region 10 by a distance O in the direction of channel width. By adjusting the distance O and S, a second conductive impurity doped in the region where the boundary area in the direction of each of the channel length of drain/source region and the boundary area of the field oxide layer 12 are contacted with each other is distributed to be separated by 0.4 $\mu$m from the gate electrode 16. On the other hand, a second conductive impurity doped in the boundary area of the channel region and the field oxide layer 12 is distributed to be separated by 0.4 $\mu$m from the gate electrode 16. The n+S/D ion-implantation mask pattern is equal to reference numeral 38' in FIG. 3 and is featured by the distance O and S. And it has the same structure as that in FIG. 3(c). In addition, the n+S/D ion-implantation of FIGS. 4, 5, 6, 7 and 8 is based on that in FIG. 3. At this time, the mask pattern of the field ion-implantation pattern 38 shows the region without the photoresist, and accordingly, the n+S/D is ion-implanted to that region.

Therefore, since the field ion-implantation is performed on the whole of the element isolation region where is deposed between the active area adjacent thereto, the element isolation between adjacent transistors can be strengthened. In addition, the regions 39a, 39b, 40a, and 40b where a gate induced breakdown occurs and where the boundary area of the n+ drain/source region and the field ion-implantation layer is adjacent to the gate electrode 16 is masked to be larger than the active region 10, thus preventing the interaction between the field ion-implantation region and the n+ drain region and thereby preventing the breakdown voltage of the high voltage transistor according to the gate induced breakdown from being reduced.

Figure 4:
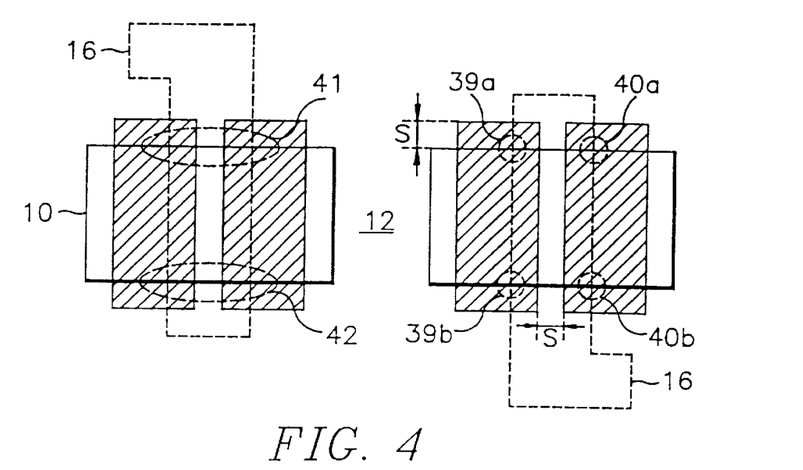
FIG. 4 is a view showing a second embodiment of a high voltage transistor according to the present invention.

FIG. 4 is a view showing a second embodiment of a high voltage transistor according to the present invention. Referring to that figure, the field ion-implantation pattern mask 38 is formed as two masks in order to cover, in a direction of channel length, the end portion corresponding to the gate electrode 16 by a distance O from the separated portion from the end portion of the active region of the drain and source to the inner area by the distance S. Further, the field ion-implantation pattern mask 38 is formed in order to have, in a direction of channel width, a larger width than the active region 10 by a distance O. By adjusting the distance O and S, a second conductive impurity doped in the region where the boundary area in the direction of each of the channel length of drain/source region and the field oxide layer 12 are contacted with each other is distributed to be separated by 0.4 µm from the gate electrode 16. On the other hand, a second conductive impurity doped in the boundary area of the channel region and the field oxide layer 12 is distributed to be separated by 0.4 µm from the gate electrode 16. Hence, the field ion-implantation is not performed in the regions 39a, 39b, 40a, and 40b where the boundary area of the n+ drain/source region and the field ion-implantation layer is adjacent to the gate electrode 16, so that the breakdown voltage of the high voltage transistor can not be reduced.

In the meanwhile, after performing the field ion-implantation, in the course of maturating the field oxide layer, segregation of the impurity implanted in the channel region of the lower portion of the gate electrode 16 occurs. As a result, since the density of the impurity in the regions 41 and 42 where the channel region is contacted with the field oxide layer 12 is lower than that in P-well as the bulk of the transistor, the punchthrough of the transistor can be improved.

Figure 5:
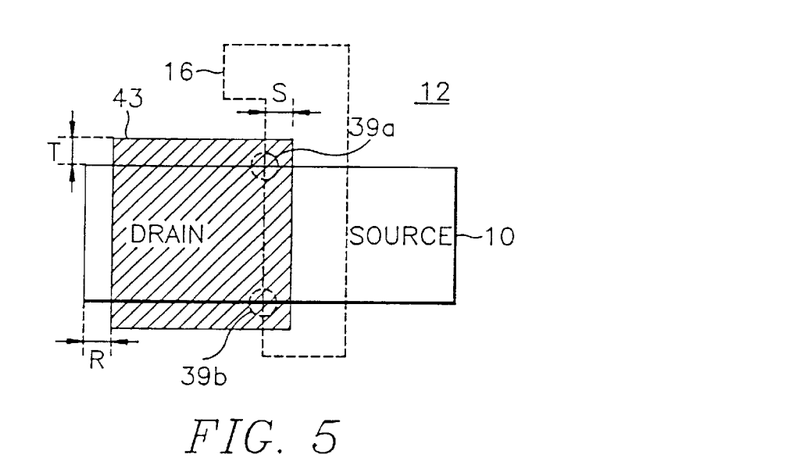
FIG. 5 is a view showing a third embodiment of a high voltage transistor according to the present invention.

Referring to FIG. 5 showing a third embodiment of the high voltage transistor according to the present invention, the gate induced breakdown is substantially arisen in the regions 39a and 39b where the boundary area of the n+ drain region applied with the high voltage and the field oxide layer 12 having the channel stop layer on the lower portion thereof is adjacent to the gate electrode 16. In FIG. 5, a field ion-implantation mask pattern 43 is laid out in order to have, in the direction of channel width of a transistor positioned on the lower portion of the gate electrode 16, a larger width than that of the active region 10 by a distance T and to have, in the direction of channel length, a larger length than that of the boundary area of the drain region and channel region by a distance S from the separated portion from the boundary area of the drain region and isolation region to the inner area by a distance R. By adjusting the distance T and S, a second conductive impurity doped in the region where the boundary area in the direction of each of the channel length of drain/source region and the field oxide layer 12 are contacted with each other is distributed to be separated by 0.4 µm from the gate electrode 16. On the other hand, a second conductive impurity doped in the boundary area of the channel region and the field oxide layer 12 is distributed to be separated by 0.4 µm from the gate electrode 16.

Accordingly, the field ion-implantation is not performed in the region 39a and 39b where the boundary area of the n+ drain/source region and the field layer 12 is adjacent to the gate electrode 16, thus reducing the breakdown voltage of the high voltage transistor according to the gate induced breakdown. The embodiment of the present invention shown in FIG. 5 is effective in case that the channel length of the transistor is small enough not to maintain the distance S like the case of FIG. 4, or in case that the isolation region with another transistor adjacent thereto is small.

Figure 6:
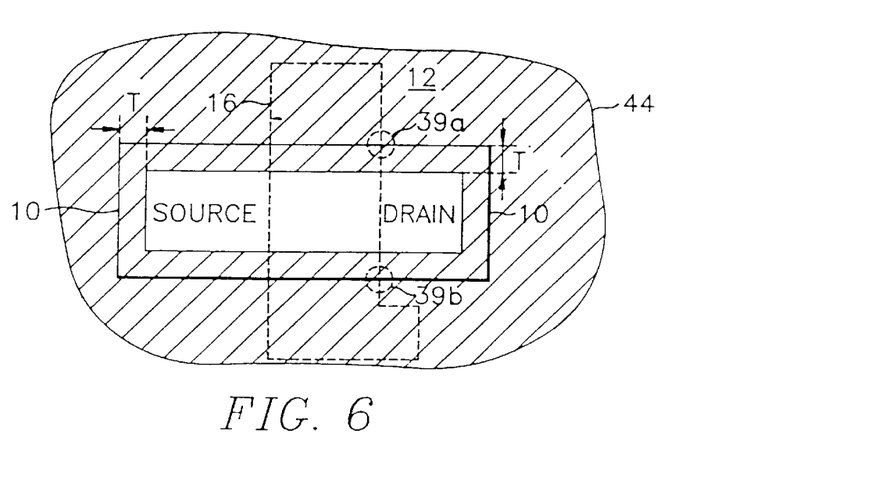
FIG. 6 is a view showing a fourth embodiment of a high voltage transistor according to the present invention.

Referring to FIG. 6 which shows a fourth embodiment of the high voltage transistor according to the present invention, the field ion-implantation is performed according to any one of the first to third embodiments mentioned above. Then, when the threshold voltage adjusting ion-implantation is executed for preventing the punchthrough of the high voltage transistor and obtaining the target threshold voltage value, a mask 44 is formed in order to perform the ion-implantation only within the active region 10 separated from the field oxide layer 12 by the distance T.

Therefore, when the threshold voltage adjusting ion-implantation is executed in the whole of the substrate, the ion-implantation is not performed in the region 39a and 39b where the boundary area of the n+ drain region and the field oxide layer 12 having the channel stop layer on the lower portion thereof is adjacent to the gate electrode 16, thus reducing the breakdown voltage of the high voltage transistor according to the gate induced breakdown.

Figure 7:
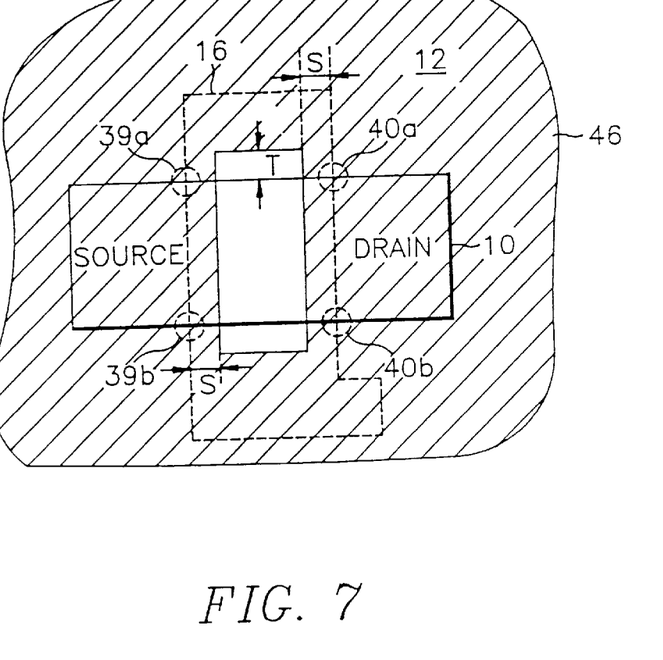
FIG. 7 is a view showing a fifth embodiment of a high voltage transistor according to the present invention.

In the meanwhile, as the channel length of the high voltage transistor is small according to the high-density of the semiconductor memory device, the punchthrough of the high voltage transistor becomes weak and the amount of the threshold voltage adjusting ion-implantation increases, thus causing the breakdown voltage thereof to be reduced. FIG. 7 is shown as a preferred embodiment capable of solving the problem that the breakdown voltage of the high voltage transistor is reduced. Referring to FIG. 7, the field ion-implantation is performed according to any one of the first to third embodiments mentioned above. Then, when the threshold voltage adjusting ion-implantation is executed for preventing the punchthrough of the high voltage transistor and obtaining the target threshold voltage value, a mask 46 is formed in order to perform the ion-implantation only in the top portion of the gate electrode exposed in the direction of the channel length to the inner area from the boundary area of the gate electrode and each of the drain/source region by the distance S and, in the direction of the channel width, to the outside from the boundary area of the active region 10 and the field oxide layer 12 by the distance T.

Thus, when the threshold voltage adjusting ion-implantation is executed in the whole of the substrate, the ion-implantation is not performed in the regions 39a, 39b', 40a and 40b where the boundary area of the n+ drain region and the field oxide layer 12 is adjacent to the gate electrode 16, thus reducing the gate induced breakdown of the high voltage transistor to improve the breakdown voltage thereof.

In addition, the threshold voltage adjusting ion-implantation is not executed in the boundary area of the source/drain region and the channel region, thereby improving the punchthrough of the high voltage transistor.

Figure 8:
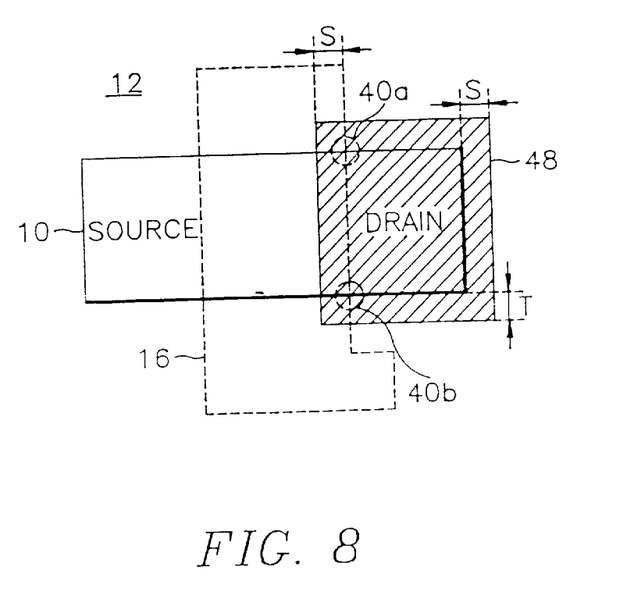
FIG. 8 is a view showing a sixth embodiment of a high voltage transistor according to the present invention.

As previously discussed, the gate induced breakdown is substantially increased in the regions where the boundary area of the n+ drain region applied with the high voltage and the field oxide layer 12 having the channel stop layer on the lower portion thereof is adjacent to the gate electrode 16. FIG. 8 is a view showing a sixth embodiment of a high voltage transistor according to the present invention. In the same manner as mentioned above, the field ion-implantation is performed according to any one of the first to third embodiments mentioned above. Then, when a threshold voltage adjusting ion-implantation mask is formed in order to have, in the direction of the channel length, a larger length by the distance S than the n+ drain region and to have, in the direction of the channel width, a larger width by the distance T than the n+ drain region. As a result, the ion-implantation is not executed in the drain region and the boundary area thereof. Thus, when the threshold voltage adjusting ion-implantation is not performed in the regions 40a and 40b where the boundary area of the n+ drain region and the field oxide layer 12 is adjacent to the gate electrode 16, thus reducing the gate induced breakdown of the high voltage transistor to improve the breakdown voltage thereof.

As discussed above, a high voltage transistor according to the present invention can prevent a gate induced breakdown thereof by improving a masking method for field ion-implantation and threshold voltage adjustment and thereby prevent the reduction of the breakdown voltage thereof, so that a high voltage transistor with good element isolation can be provided.

What is claimed is:

1. A method of fabricating a MOS transistor comprising the steps of:

forming a substrate having a first conductivity type;

forming a substantially rectangular active region mask pattern on said substrate to define a substantially rectangular active region in said substrate, said active region having length edges and width edges;

forming a substantially rectangular field ion-implantation mask pattern overlapping a central portion of said length edges of said active region and leaving exposed said width edges of said active region;

implanting ions of said first conductivity type using said field ion-implantation mask pattern as a mask;

removing said field ion-implantation mask pattern;

annealing said substrate using said active region mask pattern as a mask to simultaneously form a field oxide layer in said substrate surrounding said active region and a channel stop layer below said field oxide layer and within said active region in areas corresponding to said exposed width edges of said active region; and forming a gate electrode over said active region, and source and drain regions in said active region.

2. A method according to claim 1, wherein said step of forming said gate electrode and said source and drain regions includes:

sequentially forming a gate oxide layer and a gate electrode layer on said substrate;

forming a gate mask pattern over said gate electrode layer which defines two substantially parallel gate edges of a gate oxide and said gate electrode, said gate edges extending between and overlapping said central portion of said length edges of said active region and adjacent portions of said field oxide layer;

etching said gate oxide layer and said gate electrode layer using said gate mask pattern as a mask to form said gate oxide and said gate electrode; and implanting ions of said second conductivity type into said active region using said gate electrode as a mask to form said source and drain regions.

3. A method according to claim 1, further comprising the steps of:

forming a substantially rectangular threshold voltage adjusting ion implantation mask pattern having an opening which exposes areas of said active region between said active region width and length edges; and implanting ions of said first conductivity type into said substrate using said threshold voltage adjusting ion implantation mask pattern as a mask.

4. A method according to claim 3, wherein said threshold voltage adjusting ion implantation mask pattern opening has width and length edges which are smaller than and proportional to said active region width and length edges.

5. A method according to claim 1, further comprising the steps of:

forming a substantially rectangular threshold voltage adjusting ion implantation mask pattern having an opening which exposes central areas of said active region between said central portions of said active region length edges and which exposes portions of said field oxide layer adjacent to said central portions of said active region length edges;

implanting ions of said first conductivity type into said substrate using said threshold voltage adjusting ion implantation mask pattern as a mask.

6. A method according to claim 1, further comprising the steps of:

forming a threshold voltage adjusting ion implantation mask pattern which covers at least said drain region;

implanting ions of said first conductivity type into said substrate using said threshold voltage adjusting ion implantation mask pattern as a mask.

7. A method of fabricating a MOS transistor comprising the steps of:

forming a substrate having a first conductivity type;

forming a substantially rectangular active region mask pattern on said substrate to define a substantially rectangular active region in said substrate, said active region having length edges and width edges;

forming a substantially rectangular field ion-implantation mask pattern overlapping a central portion of said length edges of said active region and leaving exposed said width edges of said active region and a middle strip of said active region extending between said length edges;

implanting ions of said first conductivity type using said field ion-implantation mask pattern as a mask;

removing said field ion-implantation mask pattern;

annealing said substrate using said active region mask pattern as a mask to simultaneously form a field oxide layer in said substrate surrounding said active region and a channel stop layer below said field oxide layer and within said active region in areas corresponding to said exposed width edges of said active region; and forming a gate electrode over said active region and source and drain regions in said active region.

8. A method according to claim 7, wherein said step of forming said gate electrode and said source and drain regions includes:

sequentially forming a gate oxide layer and a gate electrode layer on said substrate;

forming a gate mask pattern over said gate electrode layer which defines two substantially parallel gate edges of a gate oxide and said gate electrode, said gate edges extending between and overlapping said central portion of said length edges of said active region and adjacent portions of said field oxide layer, said gate mask pattern being formed over said middle strip of said active region;

etching said gate oxide layer and said gate electrode layer using said gate mask pattern as a mask to form said gate oxide and said gate electrode; and implanting ions of said second conductivity type into said active region using said gate electrode as a mask to form said source and drain regions.

9. A method according to claim 7, further comprising the steps of:

forming a substantially rectangular threshold voltage adjusting ion implantation mask pattern having an opening which exposes areas of said active region between said active region width and length edges; and implanting ions of said first conductivity type into said substrate using said threshold voltage adjusting ion implantation mask pattern as a mask.

10. A method according to claim 9, wherein said threshold voltage adjusting ion implantation mask pattern opening has width and length edges which are smaller than and proportional to said active region width and length edges.

11. A method according to claim 7, further comprising the steps of:

forming a substantially rectangular threshold voltage adjusting ion implantation mask pattern having an opening which exposes central areas of said active region between said central portions of said active region length edges and which exposes portions of said field oxide layer adjacent to said central portions of said active region length edges; and implanting ions of said first conductivity type into said substrate using said threshold voltage adjusting ion implantation mask pattern as a mask.

12. A method according to claim 7, further comprising the steps of:

forming a threshold voltage adjusting ion implantation mask pattern which covers at least said drain region; and implanting ions of said first conductivity type into said substrate using said threshold voltage adjusting ion implantation mask pattern as a mask.

13. A method of fabricating a MOS transistor comprising the steps of:

forming a substrate having a first conductivity type;

forming a substantially rectangular active region mask pattern on said substrate to define a substantially rectangular active region in said substrate, said active region having length edges and width edges;

forming a substantially rectangular field ion-implantation mask pattern overlapping at least a drain portion of said length edges of said active region and leaving exposed said width edges of said active region;

implanting ions of said first conductivity type using said field ion-implantation mask pattern as a mask;

removing said field ion-implantation mask pattern;

annealing said substrate using said active region mask pattern as a mask to simultaneously form a field oxide layer in said substrate surrounding said active region and a channel stop layer below said field oxide layer and within said active region in areas corresponding to said exposed width edges of said active region; and forming a gate electrode over said active region and source and drain regions in said active region.

14. A method according to claim 13, wherein said step of forming said gate electrode and said source and drain regions includes:

sequentially forming a gate oxide layer and a gate electrode layer on said substrate;

forming a gate mask pattern over said gate electrode layer which defines two substantially parallel gate edges of a gate oxide and said gate electrode, said gate edges extending between and overlapping said length edges of said active region and adjacent portions of said field oxide layer, one of said gate edges overlapping said drain portion of said length edges of said active region, the other of said gate edges overlapping a source portion other than said drain portion of said length edges of said active region;

etching said gate oxide layer and said gate electrode layer using said gate mask pattern as a mask to form said gate oxide and said gate electrode; and implanting ions of said second conductivity type into said active region using said gate electrode as a mask to form said source and drain regions, said drain region being bounded by said drain portion of said active region length edges, one of said active region width edges, and one of said gate edges of said channel.

15. A method according to claim 13, further comprising the steps of:

forming a substantially rectangular threshold voltage adjusting ion implantation mask pattern having an opening which exposes areas of said active region between said active region width and length edges; and implanting ions of said first conductivity type into said substrate using said threshold voltage adjusting ion implantation mask pattern as a mask.

16. A method according to claim 15, wherein said threshold voltage adjusting ion implantation mask pattern opening has width and length edges which are smaller than and proportional to said active region width and length edges.

17. A method according to claim 13, further comprising the steps of:

forming a substantially rectangular threshold voltage adjusting ion implantation mask pattern having an opening which exposes central areas of said active region between said central portions of said active region length edges and which exposes portions of said field oxide layer adjacent to said central portions of said active region length edges; and implanting ions of said first conductivity type into said substrate using said threshold voltage adjusting ion implantation mask pattern as a mask.

18. A method according to claim 13, further comprising the steps of:

forming a threshold voltage adjusting ion implantation mask pattern which covers at least said drain region; and implanting ions of said first conductivity type into said substrate using said threshold voltage adjusting ion implantation mask pattern as a mask.

* * * * *